United States Patent [19]

Ogawa

[11] Patent Number: 5,249,169
[45] Date of Patent: Sep. 28, 1993

[54] APPARATUS FOR REPRODUCING INFORMATION

[75] Inventor: Yoichi Ogawa, Tokorozawa, Japan

[73] Assignee: Pioneer Electronic Corporation, Tokyo, Japan

[21] Appl. No.: 682,760

[22] Filed: Apr. 9, 1991

[30] Foreign Application Priority Data

Apr. 13, 1990 [JP] Japan .................................. 2-98001

[51] Int. Cl.$^5$ .......................... G11B 7/00; G11B 5/596
[52] U.S. Cl. ............................. 369/44.34; 369/44.26; 369/48; 369/32; 360/32; 360/67; 360/77.05
[58] Field of Search ................. 369/44.34, 47, 48, 49, 369/44.26, 58, 124, 32, 59; 360/32, 69, 67, 46, 77.02, 72.1, 77.05, 77.08; 341/139; 375/22, 23

[56] References Cited

U.S. PATENT DOCUMENTS

| | | | |
|---|---|---|---|
| 4,912,572 | 3/1990 | Nomura et al. | 360/67 |
| 5,001,693 | 3/1993 | Kakuta | 369/48 |
| 5,084,848 | 1/1992 | Deguchi et al. | 369/44.34 |

Primary Examiner—Aristotelis Psitos
Assistant Examiner—Muhammad Edun
Attorney, Agent, or Firm—Sughrue, Mion, Zinn, Macpeak & Seas

[57] ABSTRACT

An apparatus for reproducing information converts read signals for servo fields and read signals for data fields recorded on an optical disk to digital data. The input range of the A/D converter at the time of A/D conversion of the read signals for servo fields and that at the time of A/D conversion of the read signals for data fields are controlled so as to be different from each other.

18 Claims, 8 Drawing Sheets

APPARATUS FOR REPRODUCING INFORMATION

BACKGROUND OF THE INVENTION

The present invention relates to an apparatus for reproducing information, and more particularly to a signal processing system for reading information recorded on the basis of the sampled servo system onto an optical disk, or the like.

As media for recording various digital data, music information, image information, or the like, optical disks are known. Since writable optical disks can be subjected to a write once operation, in order to record information by the user, the demand therefor is increasing. These write once read optical disks are called a WORM (Write Once Read Multiple) optical disk or a DRAW (Direct Read After Write) optical disk. The write once read disks are such that information can be written thereonto only once. In this case, writing is carried out by converging a laser beam onto a recording surface to transform the laser beam to a thermal energy at the convergent point (of a very small area) to perforate the recording film by fusing action, etc., due to heat generated, to form signal pits, and thus write information thereinto. For the recording format, the sampled servo system is used. At the time of writing information, the information is modulated in accordance with 4/15 modulation ($_{15}C_4$: 4 out of 15 code) method. Playback or reproduction of the information thus recorded is carried out by irradiating a laser beam onto a recording track on a recording surface, including signal pits formed in a manner stated above, to apply photoelectric conversion to a reflected laser beam by using a photodetector to apply analog to digital (A/D) conversion to an electric RF signal (RF: Radio Frequency) to demodulate that digital signal by using a 4/15 decoder.

In the conventional apparatus for reproducing information of the sampled servo system, the problem therewith is that resolution of the A/D converter is not sufficiently exhibited, resulting in a poor utilization efficiency.

Namely, information subjected to 4/15 modulation by the sampled servo system is changed to that in a digital form by means of the A/D converter, and is then demodulated by means of the 4/15 decoder. This demodulation is carried out by so called Differential Detection system to carry out sampling by servo fields preformatted at 1376 portions in one track to extract 4 bits of high order level by comparison between amplitudes of data field read signal at respective channel bits every sampling period.

The channel bit data necessary for demodulation is only 4 channel bits of high order level. Other bits of low order level are unnecessary. Accordingly, it is basically unnecessary to apply A/D conversion to such bits. In the case of the prior art, however, since high and low level reference signals are set so that the input range of the A/D converter is caused to be in correspondence with the full scale value of the data field read signal as an analog input, even unnecessary data is subjected to A/D conversion.

On the other hand, from a viewpoint of resolution, it is not necessary to apply A/D conversion to the servo field read signal with a higher precision than that of the data field read signal, but it is required for reading the servo fields to allow the input range of the A/D converter to be substantially in correspondence with the full scale of the analog input. In the prior art, however, since the servo field read signal for which high precision is not required and the data field read signal for which high precision is required are subjected to A/D conversion in the same range, an A/D converter of high resolution must be used. In this connection, the resolution of the A/D converter is generally determined by the number of bits. The higher the resolution is, the more the number of bits is. This disadvantageously leads to increased cost of the apparatus for reproducing information.

SUMMARY OF THE INVENTION

An object of this invention is to provide an apparatus for reproducing information, which can read recorded information with a high accuracy by using a low bit A/D converter.

According to one aspect of this invention, we utilize an apparatus for reproducing information, which is adapted to convert, to digital data, by using an A/D converter having an input range, read signals for servo fields and read signals for data fields recorded in accordance with the sampled servo method on an information recording medium, thus to use, as reproduced or played back data, data of high order level of digital data corresponding to the read signals for data fields. A control unit is provided for effecting a control to allow the input range of the A/D converter at the time of A/D conversion of the read signals for servo fields and that at the time of A/D conversion of the read signals for data fields to be different from each other.

According to another aspect of the present invention, we provide an apparatus for reproducing information, which is adapted to convert, to digital data, by using an A/D converter having an input range, read signals for servo fields and read signals for data fields recorded in accordance with the sampled servo method on an information recording medium, thus to use, as reproduced or played back data, data of high order level of digital data corresponding to the read signals for data fields. An amplifier unit is provided for amplifying the read signals for data fields so that they have a scale value larger than a full scale value of the input range of the A/D converter. Also, offset means for applying an offset voltage to the amplified read signals for data fields.

In accordance with still another aspect of our invention, we provide an apparatus for reproducing information, which is adapted to convert, to digital data, by using an A/D converter, read signals for servo fields and read signals for data fields recorded in accordance with the sampled servo method on an information recording medium, thus to use, as reproduced or played back data, data of high order level of digital data corresponding to the read signals for data fields. An offset unit is provided for applying a positive offset voltage to the read signals for servo fields only at the time of A/D conversion of the read signals for servo fields.

According to still another aspect of this invention, there is provided an apparatus for reproducing information, which is adapted to convert, to digital data, by using an A/D converter having an input range, read signals for servo fields and read signals for data fields recorded in accordance with the sampled servo method on an information recording medium, thus to use, as reproduced or played back data, data of high order level of digital data corresponding to said read signals for data fields the apparatus comprising: an offset unit for applying a positive offset voltage to the read signals for servo fields only at the time of A/D conversion of the read signals for servo fields; and a control unit for setting the input range of the A/D converter at the time of A/D conversion of the read signals for data fields so that it is narrower than that at the time of A/D conversion of the read signals for servo fields.

According to still another aspect of this invention, there is provided an apparatus for reproducing information, which is adapted to convert, to digital data, by using an A/D converter having an input range, read signals for servo fields having peak levels and read signals for data fields having peak levels recorded in accordance with the sampled servo method on an information recording medium, thus to use, as reproduced or played back data, data of high order level of digital data corresponding to the read signal for data fields, the apparatus comprising: a control unit operative to raise each peak level of the read signals for servo fields to substantially the same level as each level of the read signals for data fields, and to set the input range of the A/D converter to a range where high order level signals of the read signals for data fields can be detected.

According to still another aspect of this invention, there is provided an apparatus for reproducing information, which is adapted to convert, to digital data, by using an A/D converter having an input range, read signals for servo fields having peak levels and read signals for data fields having peak levels recorded in accordance with the sampled servo method on an information recording medium, thus to use, as reproduced or played back data, data of high order level of digital data corresponding to the read signals for data fields, the apparatus comprising: a control unit operative to raise each peak level of the read signals for data fields to substantially the same level as each level of the read signals for servo fields, and to set the input range of the A/D converter to a range where high order level signals of the read signals for data fields can be detected.

In accordance with one aspect of this invention, the control unit effects a control to allow the input range of the A/D converter at the time of A/D convertion of servo field read signals and that at the time of A/D conversion of a field read signal to be different from each other. The change of the input range of the A/D converter is controlled, e.g., in an actual mode where the input range of an A/D converter at the time of A/D conversion of data field read signals is caused to be narrower than the input range at the time of A/D conversion of servo field read signals. A side from this mode, there is enumerated a mode where a signal level of a low level reference signal which is one of elements for determining the input range of the A/D converter at the time of A/D conversion of a data field read signals. In a manner stated above, by varying the input range of the A/D converter, the input range can be narrowed without carrying out unnecessary A/D converting operation. Thus, resolution can be improved accordingly.

In accordance with another aspect of the present invention, the amplifier unit amplifies the data field read signal so that it becomes equal to a value larger than the full scale value of the input range of the A/D converter. As a result, the data field read signal takes a value above a headroom indicating the upper limit of the A/D converter. However, since an offset voltage serving to pull down a data field read signal amplified by the offset unit provided at the next stage is applied, the peak value on the high order level side of the data field read signal falls within a full scale value of the A/D converter. In this state, since the lower order level of the data field read signal is below the low level reference signal, it is not subjected to A/D conversion. Since a signal level portion required for decoding is enlarged at the time of A/D conversion of the data field read signal, and only its portion is subjected to A/D conversion, the input range of the A/D converter can be effectively used, and the resolution is improved.

According to still another aspect of this invention, the offset unit applies a positive offset voltage to the read signals for servo fields only at the time of A/D conversion of the read signals for servo fields. As a result, the read signals for servo signals and the read signals for data fields are allowed to have the same level if the levels of the read signals for servo fields are lower than that of the read signals for data fields. Thus, both read signals can be subjected to A/D conversion within the same input range.

In accordance with still another aspect of this invention, the offset unit applies a positive offset voltage to the read signals for servo fields only at the time of A/D conversion of the read signals for servo fields, and the control unit sets the input range of the A/D converter at the time of A/D conversion of the read signals for data fields so that it is narrower than that at the time of A/D conversion of the read signals for servo fields. As a result, the resolution of the A/D converter can be improved because that unnecessary A/D converting operation does not carry out.

In accordance with still another aspect of our invention, the control unit serves to raise the peak level of the servo field read signal up to substantially the same as the peak level of the data field read signal. As a result, the servo field read signal, and the data field read signal can fall within the same input range. In that case, since it is sufficient to apply A/D conversion only channel bits of high order level, the input range itself can be narrowed, resulting in improved resolution.

According to still another aspect of this invention, the control unit operates to raise each peak level of the read signals for data fields to substantially the same level as each level of the read signals for servo fields, and to set the input range of the A/D converter to a range where high order level signals of the read signals for data fields can be detected. As a result, the servo field read signal, and the data field read signal can fall within the same input range. In that case, since it is sufficient to apply A/D conversion only channel bits of high order level, the input range itself can be narrowed, resulting in improved resolution.

As described above, in accordance with one aspect of this invention, since an approach is employed to effect a control to allow the input range at the time of A/D conversion of the servo field read signal and that at the time of A/D conversion of the data field read signal to be different from each other, the input range is suitably adjusted in dependency upon the necessity of the accuracy of an input signal. Thus, the accuracy in the A/D conversion can be improved, and the utilization efficiency of the input range of the A/D converter can be improved.

In accordance with another aspect of the present invention, since only the level of the data field read signal is expanded so that only a high signal level portion required for decoding can be adjusted to the input range of the A/D converter, a signal for which a high precision is required can be subjected to A/D conversion at a high precision.

In addition, in accordance with still another aspect of our invention, since an approach is employed to raise only the level of the servo field read signal to adjust it so that it becomes equal to the level of the data field read signal, and to narrow the input range of the A/D converter, high precision A/D conversion can be conducted within a fixed range irrespective of the servo field read signal and the data field read signal.

Further objects features and other aspects of this invention will be understood from the following detailed description of the preferred embodiments of this invention with reference to the drawings.

DESCRIPTION OF THE PREFERRED EMBODIMENTS

Write Once Read Type Optical Disk

Prior to the description of an embodiment, for helping understanding of this invention, the operation of a write once read type optical disk as an information recording medium will first be described.

There is generally a tendency that optical disks are small. In the case of a write once read type optical disk, 5.25 inches (130 mm) is becoming an international standard size. For the recording format, the continuous groove system (Type A Format) and the sampled servo system (Type B Format) are representative.

Figure 1:
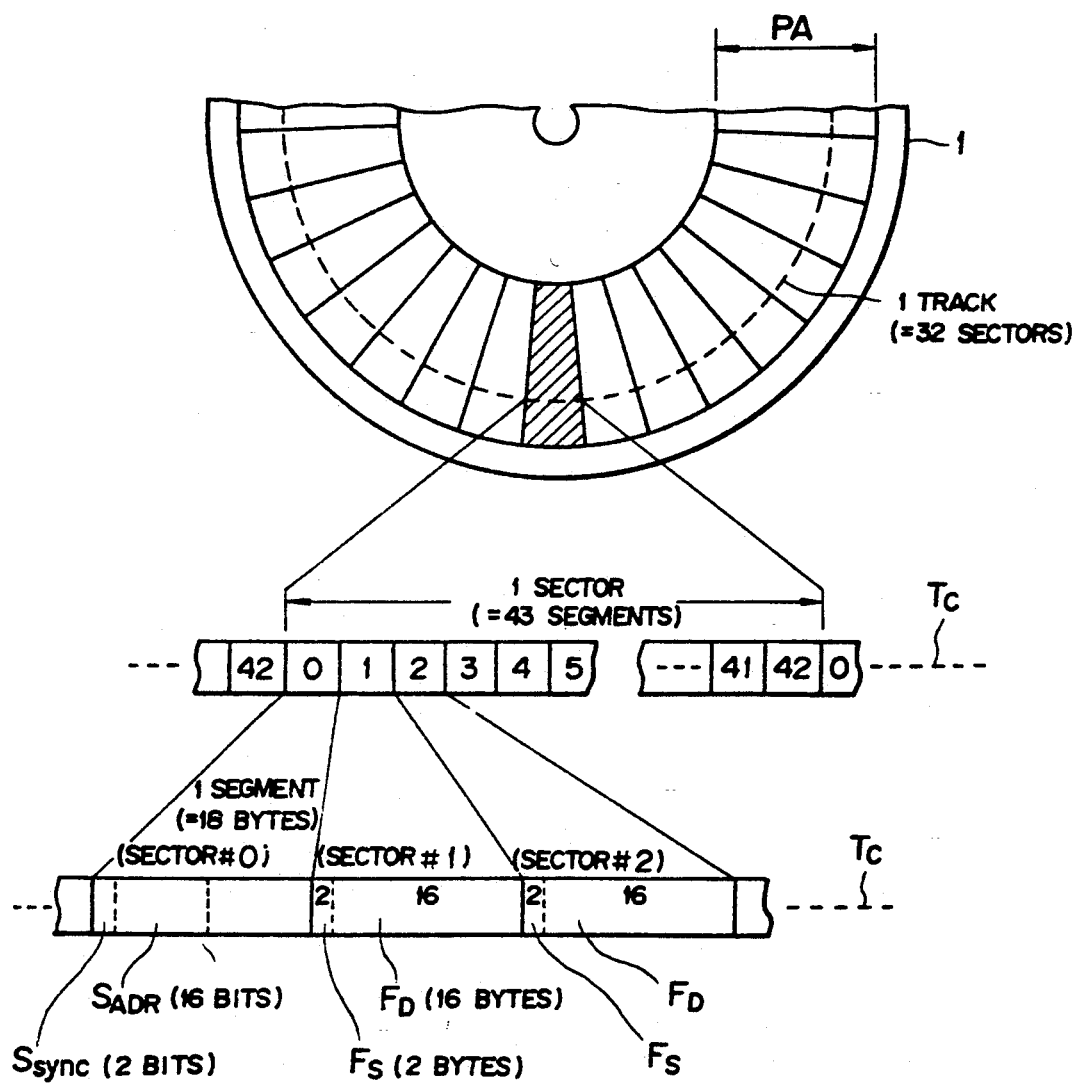
FIG. 1 is a view showing the recording format of the write once read type optical disk of the sample servo method.

The recording format of a write once read optical disk of the sampled servo system is shown in FIG. 1. In the case of a write once read optical disk of the sampled servo system, no pregroove (guide groove) is provided on the recording film of the write once read optical disk, and servo fields are preformatted at 1376 portions in one track. This write once read optical disk is characterized in that clocks for tracking error or recording/playback, etc. are generated by sampling by making use of such servo fields. As shown in FIG. 1, spiral signal tracks developed from the inner circumferential side to the outer circumferential side of a write once read optical disk 1 are formed in the program area PA of the write once read optical disk 1. One track is divided into 32 sectors. Each sector is comprised of 43 segments, and each segment is comprised of 18 bytes. At the initial segment #0 of one sector, a sector SYNC signal $S_{sync}$ (2 bits) for providing synchronization of every sector and a sector address $S_{ADR}$ (16 bits) for indicating an address of that sector are preformatted. Such a preformatting is carried out in the process of mastering of the write once read type optical disk 1. Each of segments #1 to #42 is comprised of a field of 18 bytes in total consisting of a servo field $F_s$ of 2 bytes and a data field $F_D$ of 16 bytes.

Figure 2:
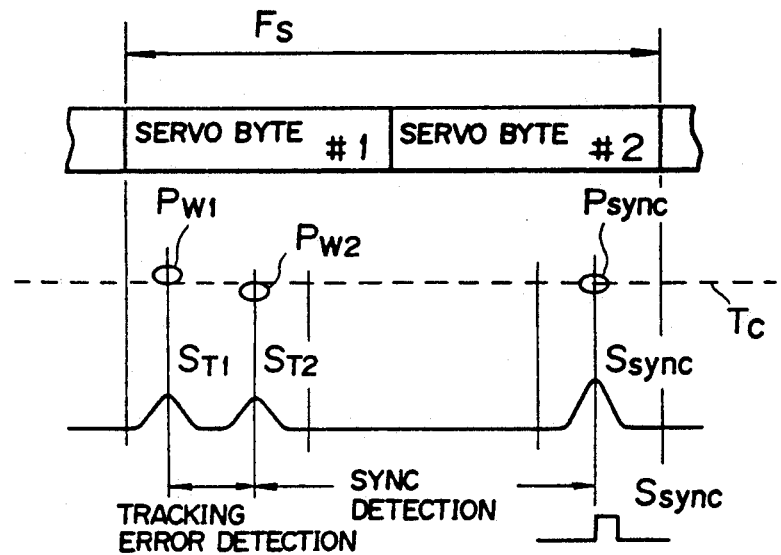
FIG. 2 is a view showing the recording format of a servo field in the sampled servo method.

The recording format of the servo field $F_s$ is shown in FIG. 2. The servo field $F_s$ of 2 bytes is divided into two servo bytes #1 and #2. Wobble pits $P_{W1}$ and $P_{W2}$ are preformatted at the third and fourth bits of the servo byte #1, respectively. These wobble pits $P_{W1}$ and $P_{W2}$ are arranged in a manner that they are shifted on the left and right sides in a trace direction (radial direction of the write once read type optical disk 1) using the track center TC as a boundary, thus to carry out a tracking error detection on the basis of the difference between the intensity of light reflected from the wobble pit $P_{W1}$ and that from the wobble pit $P_{W2}$. At the twelfth bit of the servo byte #2, a SYNC pit $P_{sync}$ is preformatted. The wobble pit $P_{W2}$ and the SYNC pit $P_{sync}$ are spaced from each other by 19 channel clocks length, and the portion therebetween is subjected to a mirror finish. For a time period corresponding to that portion, 19 channel clocks are counted to provide synchronization every respective segments, and focus detection is carried out for this SYNC detection period. Tracking signals $S_{T1}$ and $S_{T2}$, and a sector SYNC signal $S_{sync}$ provided by reading the above-mentioned servo field $F_s$ by using a laser beam are also shown in FIG. 2.

Writing of Record Information onto a Write Once Read Type Optical Disk

Writing of record information onto the write once read optical disk 1 is carried out in the data field $F_D$ shown in FIG. 1. In writing record information, record information is modulated by the 4/15 modulation method. The signal thus modulated is written onto the recording film of the write once read type optical disk 1. It is to be noted that the wobble pits $P_{W1}$ and $P_{W2}$, and the SYNC pit $P_{sync}$ in the preformatted servo field $F_s$ are modulated by the 4/15 modulation method, and are thus formed.

In accordance with the 4/15 modulation method, each byte (8 data bits) in the data field $F_D$ serving as a user byte is divided into two sections every four bits, thus to convert respective 4 bits of higher order (MSN: Most Significant Nibble) and 4 bits of lower order (LSN: Least Significant Nibble) to 15 channel bits. Thus, 4 bits in total of two odd position bits among 15 channel bits on the MSN side and two even position bits among 15 channel bits on the LSN side are used as data bits. This relationship is symbolically expressed as follows:

$$2^8 < {}_{15}C_4$$
$$\text{(256 bits)} \quad \text{(1365 bits)}$$

On the other hand, writing onto the write once read type optical disk 1 is carried out by the optical method using a laser beam. A laser beam for writing is converged onto the recording film of the write once read type optical disk 1 through an optical system. The laser beam thus converged is transformed to a thermal energy at a very small area portion of the recording film to which the laser beam is irradiated. By virtue of this thermal energy, the property of the recording film at the irradiated portion of the laser beam changes. The change of the property of the recording film means, e.g., fusion, or sublimation, etc. of the recording film. By this property change, the recording film is perforated. Holes thus formed serve as signal pits. Presence and absence of these holes correspond to data on the tracks.

Figure 3:
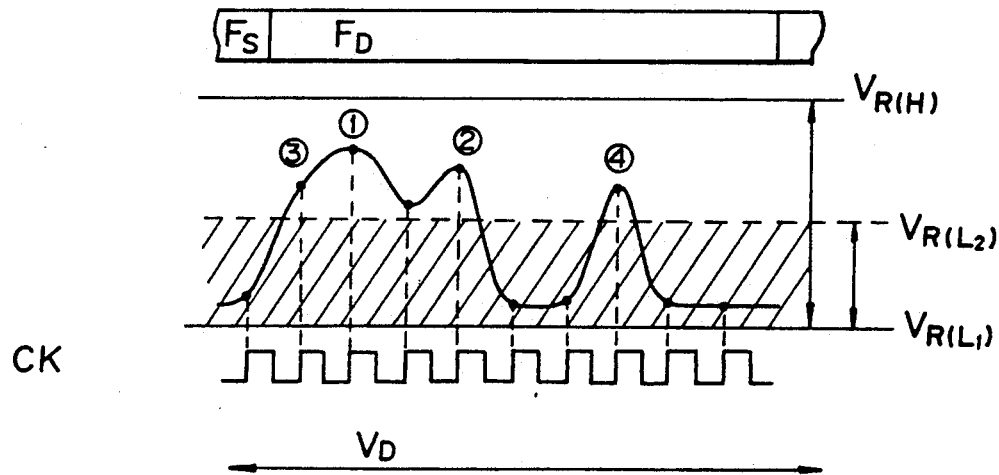
FIG. 3 is a view showing the waveform of a data field read signal.

The problems with the previously described sampled servo system will now be described with reference to FIG. 3. As shown in FIG. 3, the channel bit data required for demodulation are only channel bits positioned at 1, 2, 3 and 4 which are of a high level. Other bits which are of a low level are unnecessary for demodulation. It is thus unnecessary to carry out A/D conversion on the low level bits. In the prior art, however, since high and low level reference signals are set so as to allow the input range of the A/D converter to be in correspondence with the full scale value of the data field read signal as an analog input, even unnecessary data is subjected to A/D conversion.

On the other hand, from a viewpoint of resolution, it is unnecessary to apply A/D conversion to the servo field read signal with a higher precision higher than that of the data field read signal. In the case of reading of the servo field, it is required to allow the input range of the A/D converter to be substantially in correspondence with the full scale of the analog input. In the prior art, however, since the servo field read signal for which a high precision is not required and the data field read signal for which a high precision is required are subjected to A/D conversion by the same input range, an A/D converter of high resolution must be used. In this connection, the resolution of the A/D converter is generally determined by the number of bits. The higher the resolution is, the more the number of bits is, leading to increased cost of the apparatus for reproducing information.

First Embodiment

Figure 4:
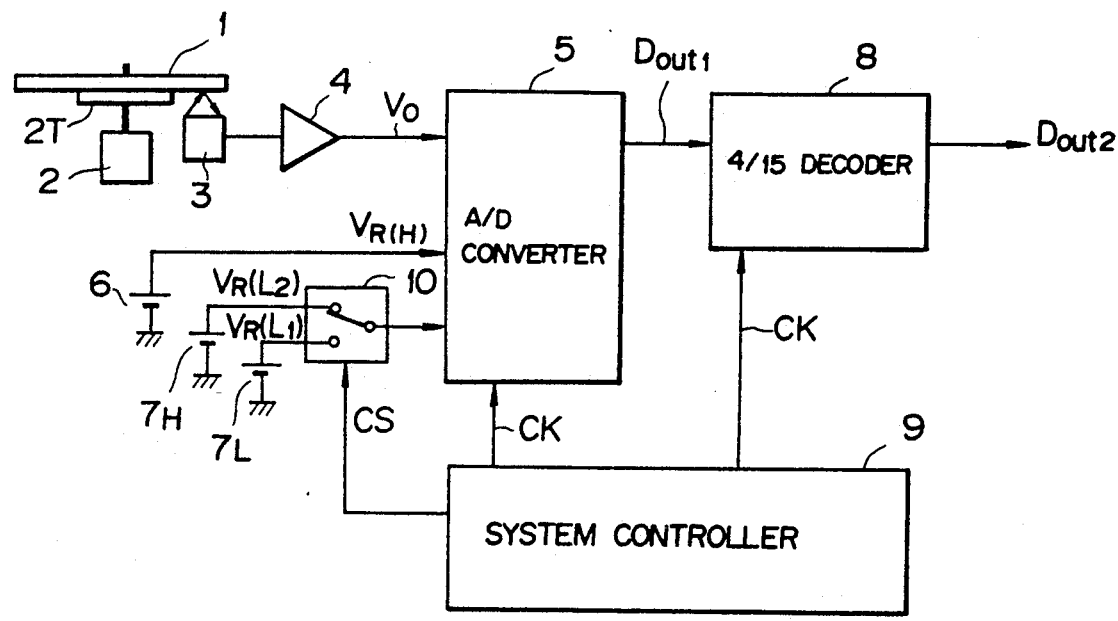
FIG. 4 is a view showing the configuration of a first embodiment of an apparatus for reproducing information according to the present invention.

The configuration of a first embodiment of an apparatus for reproducing information according to this invention is shown in FIG. 4. A write once read type optical disk 1 as an information recording medium is mounted on a turn table 2T, and is rotated at a predetermined number of rotations by means of a spindle motor 2. Along with this rotation, signal pits on the recording film provided on the write once read type optical disk 1 are read by means of a photodetector 3. The recording format of the optical disks 1 is as shown in FIG. 1. Reading by the photodetector 3 is carried out by an optical method using a laser beam. The photodetector 3 outputs written information, i.e., a read RF signal $V_o$ corresponding to presence and absence of signal pits. The read RF signal $V_o$ is delivered to a flat amplifier 4.

The flat amplifier 4 amplifies the read RF signal $V_o$ at a predetermined amplification gain in order to facilitate signal processing at the succeeding stage because the signal level of the read RF signal $V_o$ from the photodetector 3 is very low. The flat amplifier 4 includes a differential amplifier, etc., and has flat frequency characteristics. The amplified read RF signal $V_o$ is delivered to an A/D converter 5.

The A/D converter 5 samples, at a period of a playback clock CK signal from a system controller 9, a read RF signal $V_o$ including a servo field read signal $V_s$ and a data field read signal $V_D$ in accordance with the playback clock from the system controller 9 to sequentially output corresponding digital data $D_{out1}$.

Figure 5:
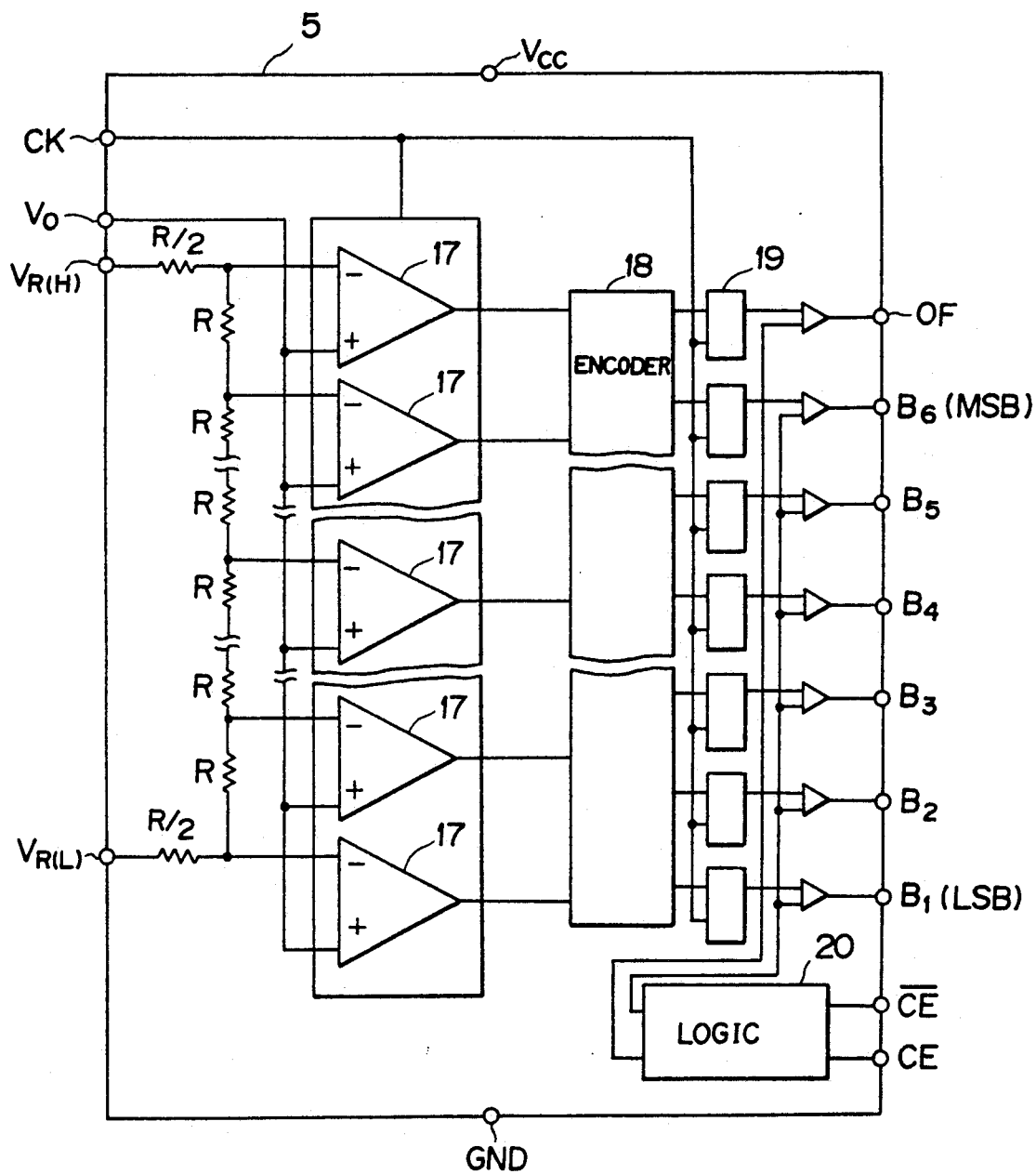
FIG. 5 is a view showing an actual example of the A/D converter in FIG. 3.

An actual example of the A/D converter 5 is shown in FIG. 5. This A/D converter 5 is an example of a parallel type A/D converter called a flash ADC. The A/D converter 5 includes a plurality of comparators 17 for performing comparative operations by a reference voltage using 1LSB (LSB: Least Significant Bit) as a unit produced by voltage dividing a voltage between voltages given by high and low level reference signals $V_{R(H)}$ and $V_{R(L)}$ by using a voltage dividing resistor. In the case of n bits, the A/D converter 5 is comprised of $(2n-1)$ comparators 17. Respective comparators 17 carry out comparative operation in accordance with the playback clock CK, and respective outputs therefrom are inputted to an encoder 18. The encoder 18 converts an input signal to binary code, etc. Coded input signals are held by latching circuits 19 provided in correspondence with respective bits, they are outputted from the output terminals of $B_1$ (LSB) to $B_6$ (MSB: Most Significant Bit) at timings of chip enable signals CE and $\overline{CE}$. The symbol OF represents an overflow terminal. $V_{cc}$ is a power supply voltage on the high potential side for operating the system, and GND is a grounding voltage. Here, the input range of the A/D converter 5 is determined by the high level reference signal $V_{R(H)}$ and the low level reference signal $V_{R(L)}$. When the low level reference signal $V_{R(L)}$ is raised, the input range becomes narrow, resulting in increased resolution. Digital data $D_{out1}$ from the A/D converter 5 is inputted to the 4/15 decoder 8.

The high level reference voltage source 6 is connected to the terminal for the high level reference signal $V_{R(H)}$ of the A/D converter 5, and a changeover switching circuit 10 is connected to the terminal for the low level reference signal $V_{R(L)}$. A low level reference voltage source 7L for producing a first low level reference signal $V_{R(L1)}$ is connected to one input terminal of the changeover switching circuit 10, and a low level reference voltage source 7H for producing a second low level reference signal $V_{R(L2)}$ is connected to the other input terminal. The first and second low level reference signals $V_{R(L1)}$ and $V_{R(L2)}$ have the relationship expressed as follows:

$$V_{R(L1)} < V_{R(L2)} < V_{R(H)}.$$

The changeover switching circuit 10 responds to a changeover control signal CS from the system controller 9 to switch the connection to either the terminal for the low level reference signal $V_{R(L1)}$ or to the terminal for the low level reference signal $V_{R(L2)}$. The switching timing $T_{sw}$ for the changeover control signal CS is the time at which the read RF signal $V_o$ shifts from the servo field read signal $V_s$ to the data field read signal $V_D$.

The 4/15 decoder 8 receives digital data $D_{out1}$ from the A/D converter 5 to output data $D_{out2}$. Namely, in the 4/15 decoder 8, digital data $D_{out1}$ are compared with each other with respect to respective odd positions (MSN side) and even positions (LSN side). Thus, the 4/15 decoder 8 selects 4 channel bits in total of two channel bits on the MSN side and those on the LSN side in order of the bit data level. The channel bits thus selected are converted by the conversion table stored in the ROM (Read Only Memory) in the 4/15 decoder 8. Thus, data of 8 bits in total of 4 bits on the MSN side and 4 bits on the LSN side, i.e., data of 1 byte is outputted.

Figure 6:
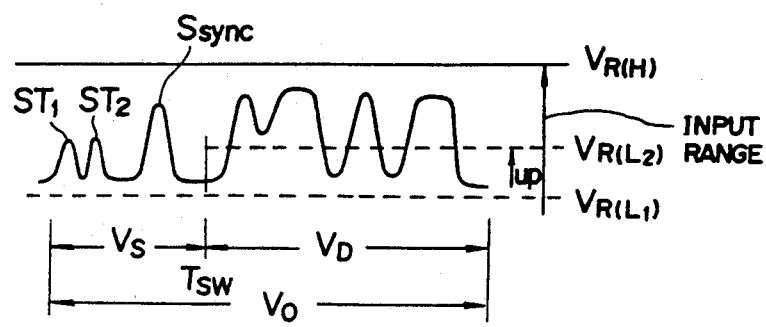
FIG. 6 is a view showing an example of a read RF signal.

The principal operation of the apparatus shown in FIG. 4 will now be described. A read RF signal $V_o$ is inputted to the analog input terminal of the A/D converter 5. The read RF signal $V_o$ includes, as shown in FIG. 6, a servo field read signal $V_S$ and a data field read signal $V_D$. At the time point when the servo field read signal $V_S$ is inputted, the switching control signal CS is not outputted. The changeover switching circuit 10 is connected to the low level reference voltage source 7L side. Accordingly, the low level reference signal $V_{R(L1)}$ is equivalent to the low level reference signal. Thus, the A/D converter 5 is operated within the input range determined by the low level reference signal $V_{R(L1)}$ and the high level reference signal $V_{R(H)}$. Then, at the time point $T_{sw}$ shifting from the servo field read signal $V_S$ to the data field read signal $V_D$, the switching control signal CS is outputted from the system controller 9. As a result, the changeover switching circuit 10 switches the connection to the low level reference voltage source 7H side. By this switching, the level reference signal $V_{R(L2)}$ on the higher potential side is delivered to the A/D converter 5 (see FIG. 6). As a result, at the time of A/D conversion of the data field read signal $V_D$, A/D conversion is carried out within the input range determined by the low level reference signal $V_{R(L2)}$ and the high level reference signal $V_{R(H)}$. Accordingly, the portion for which A/D conversion is not required of the data field read signal $V_D$ is not subjected to A/D conversion. Thus, only the high signal level necessary for decoding can be subjected to A/D conversion with a high resolution.

Second embodiment

Figure 7:
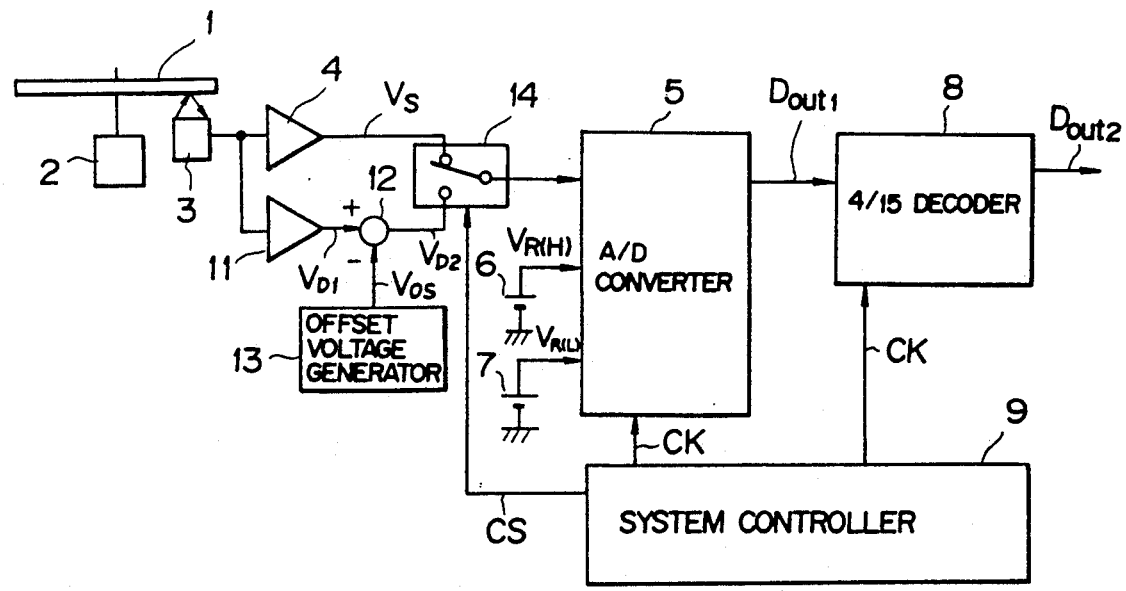
FIG. 7 is a view showing the configuration of a second embodiment of an apparatus for reproducing information according to the present invention.
Figure 8A:
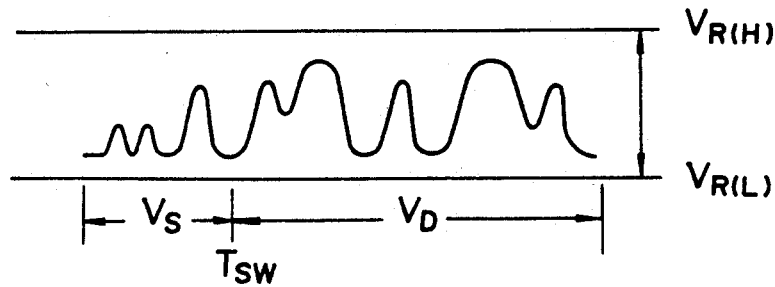
FIG. 8(a)–8(c) are views showing the signal processing process in the second embodiment shown in FIG. 6.
Figure 8B:
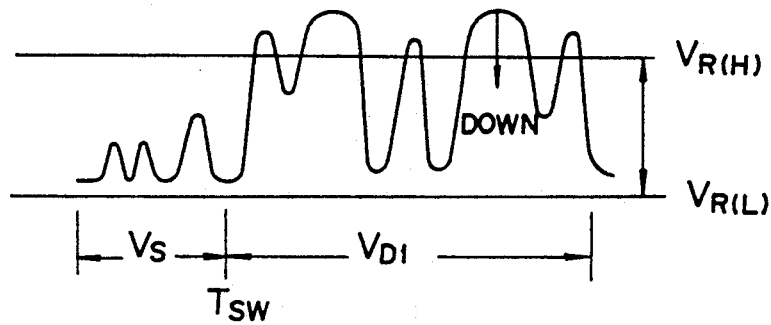

A second embodiment according to this invention is shown in FIGS. 7 and 8. The feature of the second embodiment is as follows. A flat amplifier 11 and an adder circuit 12 are connected in parallel with a flat amplifier 4. Further, an output from an adder circuit 12 and an output from the flat amplifier 4 are permitted to be selectively inputted to the analog input terminal of an A/D converter 5 by using a changeover switching circuit 14. In addition, switching of the changeover switching circuit 14 is controlled by a switching control signal CS from a system controller 9.

The flat amplifier 11 has a gain set to a value higher than that of the flat amplifier 4. The flat amplifier 11 is constituted by using a differential amplifier, etc. in the same manner as in the flat amplifier 4.

The adder 12 is constituted by using an operational amplifier to add $V_{D1}$ from the flat amplifier 11 and a negative offset voltage $V_{os}$ (actually, $V_{D1} - V_{os}$) from an offset voltage generator 13 connected to the adder 12. $V_{D2}$ outputted from the adder 12 is delivered to one of terminals of the changeover switching circuit 14.

An offset voltage $V_{os}$ of the offset voltage generator 13 is set as follows. Namely, this offset voltage $V_{os}$ is set to a voltage having a magnitude sufficient to pull down, in a direction indicated by an arrow (DOWN) of FIG. 8 (c), the peak value of $V_{D1}$ amplified by the flat amplifier 11 by a value determined so that the peak value falls within a headroom ($V_{R(H)}$) indicating the upper limit of A/D conversion of the A/D converter 5 even if the peak value is above the headroom.

The high level reference signal $V_{R(H)}$ and the low level reference signal $V_{R(L)}$ of the A/D converter 5 are fixed by the high level reference voltage source 6 and the low level reference voltage source 7, respectively. Accordingly, the input range of the A/D converter is not changed. Other components are the same as those of the configuration of the first embodiment shown in FIG. 4.

Figure 8C:
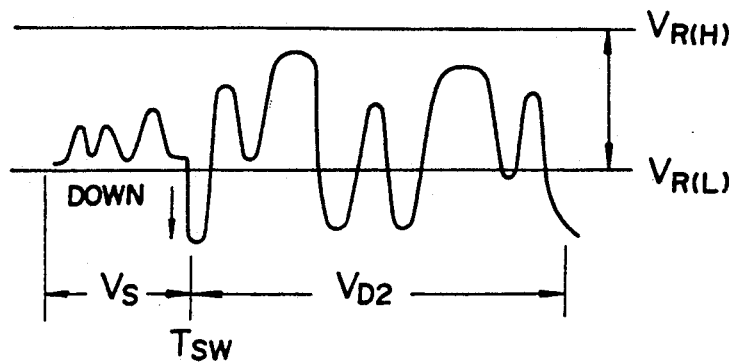

The principal operation of the second embodiment will now be described with reference to FIG. 8. A read RF signal $V_o$ is inputted to the analog input terminal of the A/D converter 5 (FIG. 8(a)). The read RF signal $V_o$ includes, as shown in FIG. 8(a), a servo field read signal $V_s$ and a data field read signal $V_D$. At the time point when the servo field read signal $V_s$ is inputted, the changeover switching circuit 14 is connected to the flat amplifier 4 side. Thus, the A/D converter 5 carries out an A/D conversion within the input range determined by the high level reference signal $V_{R(H)}$ and the low level reference signal $V_{R(L)}$. Then, at the time point of $T_{sw}$, a switching control signal CS is outputted from the system controller 9. As a result, the changeover switching circuit 14 switches the connection to the adder 12 side. The data field read signal $V_D$ is amplified at a gain higher than that of the flat amplifier 4 at the flat amplifier 11. The signal thus amplified is outputted as $V_{D1}$. The setting quantity of the gain is, as shown in FIG. 8(a), for example, a quantity equal to a value when the high level portion of $V_{D1}$ is above the high level reference signal $V_{R(H)}$ of the A/D converter 5. However, if $V_{D1}$ is inputted to the analog input of the A/D converter 5, the A/D converter may overflow. Accordingly, a technique is employed to pull down the entirety of $V_{D1}$ by a negative offset voltage $V_{os}$ so that the high level portion of $V_{D1}$ can fall within the range to such an extent not to overflow, thus to generate $V_{D2}$ (FIG. 8(c)). As a result, since only $V_{D2}$ required for decoding by the 4/15 decoder 8 is subjected to A/D conversion within the input range determined by the high level reference signal $V_{R(H)}$ and the low level reference signal $V_{R(L)}$, resolution is improved.

Third Embodiment

Figure 9:
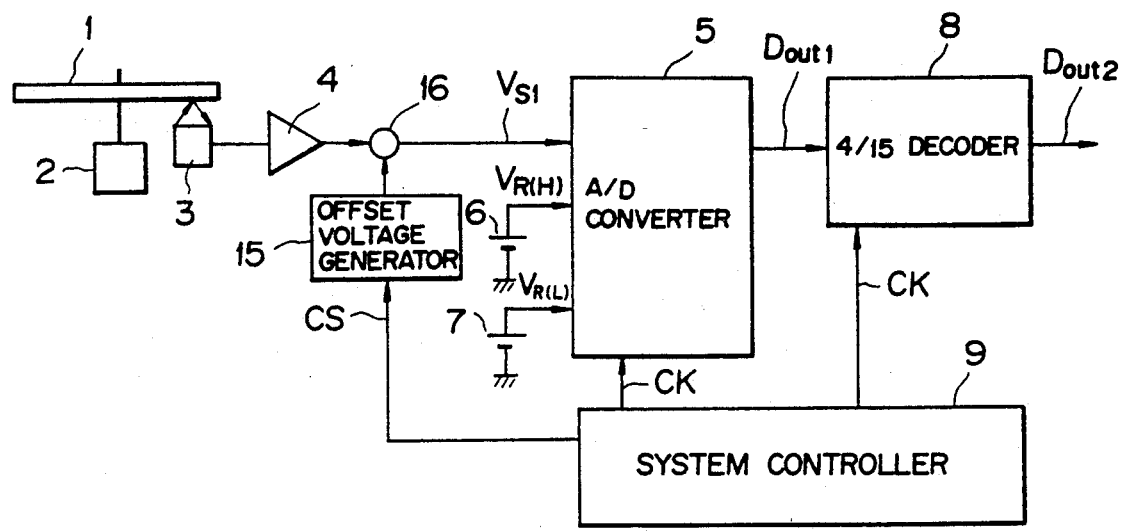
FIG. 9 is a view showing the configuration of a third embodiment of an apparatus for reproducing information according to the present invention.
Figure 10:
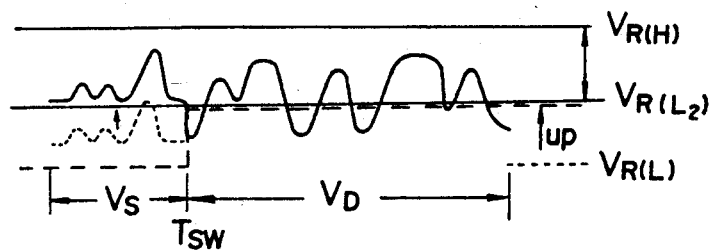
FIG. 10 is a view for explaining the operation of the third embodiment shown in FIG. 9.

A third embodiment according to this invention is shown in FIGS. 9 and 10. The feature of this embodiment is as follows. An adder 16 and an offset voltage generator are provided between the flat amplifier 4 and the analog input terminal of the A/D converter 5. The entirety of the signal level of the servo field read signal $V_s$ is subjected to level conversion to raise its level to a level equivalent to the data field read signal, and to allow the A/D converter 5 to be operative within a narrow input range.

The adder circuit 16 is comprised of an operational amplifier, etc. to add a positive offset voltage $V_{os}$ from the offset voltage generator 15 only with respect to a servo field read signal $V_s$ from the flat amplifier 4.

The offset voltage generator 15 generates a $V_{os}$ sufficient to raise the entirety of the signal level of the servo field read signal $V_s$ to a level equivalent to the data field read signal $V_D$ at a timing of a switching control signal CS from the system controller 9 to allow $V_{os}$ to be 0 volts at the time of $T_{sw}$.

The operation of the apparatus shown in FIG. 9 will now be described with reference to FIG. 10. A read RF signal $V_o$ is inputted to the analog input terminal of the A/D converter 5. The read RF signal $V_o$ includes, as indicated by broken lines in FIG. 10, a servo field read signal $V_s$ and a data field read signal $V_D$. When the servo field read signal $V_s$ is inputted, a switching control signal CS is delivered to the offset voltage generator 15. As a result, the offset voltage generator 15 outputs a positive offset voltage $V_{os}$ to the adder circuit 16. The adder circuit 16 adds the offset voltage $V_{os}$ to the servo field read signal $V_s$ to deliver, to the analog input of the A/D converter 5, a servo field read signal $V_{s1}$ of which level is raised to a level equivalent to the data field read signal $V_D$. At the time point of $T_{sw}$, the switching control signal CS from the system controller is completed. As a result, an offset voltage $V_{os}$ (=0 V) from the offset voltage generator 15 is inputted to the adder circuit 16. Namely, the data field read signal $V_D$ at this time is the same as the data field read signal $V_D$ from the flat amplifier 4. In this way, $V_{s1}$ and the data field read signal $V_D$ are allowed to have the same level. Thus, both signals can be subjected to A/D conversion within the same input range. In order to apply A/D conversion to only the portion required for decoding by the 4/15 decoder 8 of the data field read signal, there may be employed an arrangement to use the low level reference voltage source 7 as a variable voltage source, and to raise, by the switching control signal CS, the level of the low level reference signal $V_{R(L)}$ to the level of the low level reference signal $V_{R(L2)}$. When such a configuration is employed, A/D conversion can be carried out within a narrow range. Alternatively, there may be employed an arrangement in which the low level reference voltage source 7 is comprised of low level reference voltage sources 7A and 7L, and a changeover switching circuit 10 as shown in FIG. 4 to carry out switching by a switching control signal CS from the system controller 9, or there may be employed an approach to fix in advance the high level reference signal $V_{R(H)}$ and the low level reference signal $V_{R(L)}$ to a value to fall within a narrow range. As described above, the third embodiment is effective in the case where the amplitude of the servo field read signal is smaller than the amplitude of the data field read signal $V_D$.

Fourth Embodiment

Figure 11:
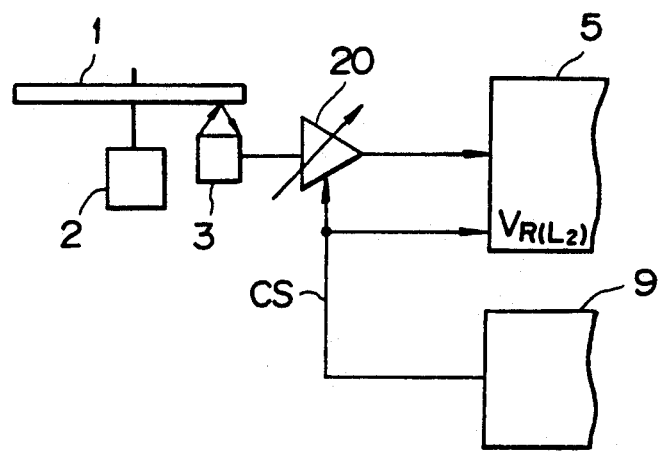
FIG. 11 is a view showing the configuration of a fourth embodiment of an apparatus for reproducing information.

The configuration of a fourth embodiment of this invention is shown in FIG. 11. This embodiment is a modification of the third embodiment (as shown in FIG. 9). In this embodiment, without using the offset voltage generator 15 and the adder circuit 16, the level conversion of the servo field read signal $V_s$ is carried out as follows. Namely, such a level conversion is carried out to allow the flat amplifier 4 to be comprised of a variable gain amplifier 20 to control the variable gain amplifier 20 by a switching control signal CS from the system controller 9. In this case, an approach is employed to raise the gain of the switching control signal CS at the time point when the servo field read signal $V_s$ is inputted to return it to an ordinary gain, which is the same gain as that of the flat amplifier 4, at the time of $T_{sw}$. The variable gain amplifier 20 is comprised of, e.g., a VCA (Voltage controlled Amplifier).

Figure 12:
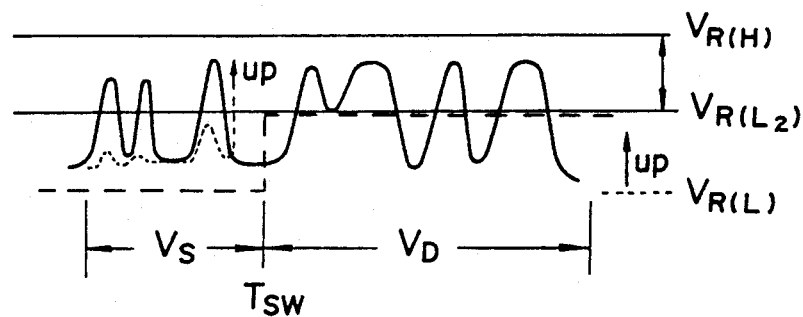
FIG. 12 is a view for explaining the operation of the fourth embodiment shown in FIG. 11.
Figure 13:
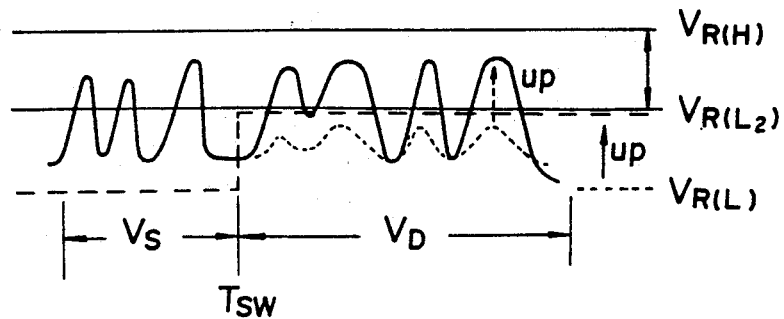
FIG. 13 is a view for explaining the operation of a modified embodiment of the fourth embodiment.

The operation of a fourth embodiment shown in FIG. 11 will now be described with reference to FIG. 12. When a servo field read signal $V_s$ is inputted, a switching control signal CS from the system controller 9 is delivered to the control terminal of the variable gain amplifier 20. As a result, the variable gain amplifier 20 amplifies the servo field read signal $V_s$ at a high gain. This gain is set so that the level of the servo field read signal $V_s$ is equal to that of the high level portion of the data field read signal $V_D$. At the time of $T_{sw}$, the gain of the variable gain amplifier 20 returns to an ordinary gain by the switching control signal CS. In this way, the level of the high level portion of the servo field read signal $V_s$ and that of the high level portion of the data field read signal $V_D$ are equal to each other. Accordingly, an approach may be employed to raise the low level reference signal $V_{R(L)}$ of the A/D converter 5 to $V_{R(L2)}$, thus making it possible to provide an input range required for decoding by the 4/15 decoder 8. This implies that an A/D converter 5 having a less number of bits can be used, resulting in reduced cost. The fourth embodiment may be modified as follows. Namely, as shown in FIG. 13, in the case where the amplitude of the data read signal $V_D$ is smaller than that of the servo field read signal $V_s$, there may be employed an arrangement to raise the entirety of the level of the data field read signal $V_D$, and to allow the A/D converter 5 to be operative within a narrow range.

While explanation has been given by taking an example of a write once read type optical disk as a recording medium in the above-described respective embodiments, as long as the recording format is based on the sampled servo system, any kind of optical disks may be used. For other optical disks, there are enumerated, e.g., E-DRAW such as a magnetooptical disk, or a phase change type optical, etc., or a pigment type optical disk, etc. However, optical disks used in this invention are not limited to the above-mentioned optical disks.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. An apparatus for reading and reproducing information recorded on a recording medium, said information being recorded in servo fields, which contain information relating to positioning of a reading device with respect to said recording medium, and data fields, which contain information relating to data to be reproduced, said apparatus comprising:

an A/D convertor coupled to said reading device so as to convert an output signal of said reading device, which is representative of said information, to digital data;

means for determining whether said output signal corresponding to one of said servo fields or one of said data fields;

means for setting the input range of said A/D convertor;

control means, coupled to said determining means and said setting means, for instructing said setting means to set the input range of said A/D convertor to a first range when said A/D converter is converting said output signal corresponding to said servo fields and a second range when said A/D converter is converting said output signal corresponding to said data fields, said first and second ranges being different from each other.

2. An apparatus for reproducing information as set forth in claim 1, wherein said second range is narrower than said first range.

3. An apparatus for reproducing information as set forth in claim 2, wherein the input range of said A/D converter is determined by a high level reference signal and a low level reference signal output by said setting means, said control means being operative to instruct said setting means to raise the level of said low level reference signal at the time of A/D conversion of said output signal corresponding to each of said data fields.

4. An apparatus for reproducing information as set forth in claim 1, wherein said A/D converter has an input range determined by a high level reference signal and a low level reference signal outputted by said setting means, said control means instructing said setting means to raise the level of said low level reference signal at the time of A/D conversion of said output signal corresponding to each of said data fields.

5. An apparatus for reproducing information as set forth in claim 4, wherein said setting means comprises:
a high level reference signal source for supplying the high level reference signal;
a pair of low level reference signal sources, each having a level different from each other, for supplying the low level reference signal; and
switching means for selectively coupling one of said low level reference sources to said A/D convertor in accordance with an instruction from said control means.

6. An apparatus for reading and reproducing information recorded on a recording medium, said information being recorded in servo fields, which contain information relating to positioning of a reading device with respect to said recording medium, and data fields, which contain information relating to data to be reproduced, said apparatus comprising:
an A/D convertor coupled to said reading device so as to convert an output signal of said reading device, which is representative of said information, to digital data;
means for determining whether said output signal corresponds to said servo fields or said data fields;
amplifier means coupled to said reading device for amplifying said output signal of said reading device corresponding to information in said data fields so that said output signal has a scale value which is larger than a full scale value of the input range of said A/D convertor; and
offset means for generating and applying an offset voltage to said output signal corresponding to information in said data fields.

7. An apparatus for reproducing information as set forth in claim 6, wherein said output signal corresponding to each of said data fields has peak levels, and said offset means is operative to apply, at the time of A/D conversion of said output signal corresponding to one of said data fields, a negative offset voltage such that the peak level of said output signal corresponding to each of said data fields falls within the input range of said A/D converter.

8. An apparatus for reproducing information as set forth in claim 6, wherein said amplifier means comprises:
a first amplifier for amplifying the output signal corresponding to said servo fields by a first gain corresponding to the full scale of said A/D convertor;
a second amplifier for amplifying the output signal corresponding to said data fields by a second gain which is higher than the first gain, said offset means applying the offset voltage to the output signal of said second amplifier; and
switching means for coupling said first amplifier to said A/D convertor when the output signal is determined to correspond to said servo fields and for coupling said second amplifier to said A/D convertor when the output signal is determined to correspond to said data fields.

9. An apparatus for reading and reproducing information recorded on a recording medium, said information being recorded in servo fields, which contain information relating to positioning of a reading device with respect to said recording medium, and data fields, which contain information relating to data to be reproduced, said apparatus comprising:
an A/D convertor coupled to said reading device so as to convert an output signal of said reading device, which is representative of said information, to digital data;
means for determining whether an output signal of said reading device corresponds to said servo fields or said data fields;
offset means coupled to said determining means for generating and applying a positive offset voltage to said output signal when said output signal corresponds to said servo fields; and
means for setting the input range of said A/D converter to be narrower when A/D conversion is to be accomplished for information corresponding to said data fields than when A/D conversion is to be accomplished for information corresponding to said servo fields.

10. An apparatus for reproducing information as set forth in claim 9, wherein said A/D converter has an input range determined by a high level reference signal and a low level reference signal, said control means being operative to raise the level of said low level reference signal at the time of A/D conversion of said output signal corresponding to each of said data fields.

11. An apparatus for reading and reproducing information recorded on a recording medium, said information being recorded in servo fields, which contain information relating to positioning of a reading device with respect to said recording medium, and data fields, which contain information relating to data to be reproduced, said apparatus comprising:
an A/D convertor coupled to said reading device so as to convert an output signal of said reading device, which is representative of said information, to digital data;
means for determining whether an output signal of said reading device corresponds to said servo fields or one of said data fields;
peak level raising means coupled to said determining means for raising each peak level of said output signal corresponding to said servo fields to substantially the same level as said output signal corresponding to said data fields; and setting means coupled to said determining means for setting the input range of said A/D convertor to a range within which high order level signals of said output signal corresponding to said data fields can be detected.

12. An apparatus for reproducing information as set forth in claim 11, wherein said peak level raising means includes a variable gain amplifier.

13. An apparatus for reproducing information as set forth in claim 12, wherein said A/D converter has an input range determined by a high level reference signal and a low level reference signal, said setting means being operative to raise the level of said low level reference signal at the time of A/D conversion of said output signal corresponding to said data fields.

14. An apparatus for reproducing information as set forth in claim 11, wherein said A/D converter has an input range determined by a high level reference signal and a low level reference signal, said setting means being operative to raise the level of said low level reference signal at the time of A/D conversion of said output signal corresponding to said data fields.

15. An apparatus for reading and reproducing information recorded on a recording medium, said information being recorded in servo fields, which contain information relating to positioning of a reading device with respect to said recording medium, and data fields, which contain information relating to data to be reproduced, said apparatus comprising:

an A/D convertor coupled to said reading device so as to convert an output signal of said reading device, which is representative of said information, to digital data;

means for determining whether an output signal of said reading device corresponds to said servo fields or said data fields;

peak level raising means coupled to said determining means for raising each peak level of said output signal corresponding to said data fields to substantially the same level as said output signal corresponding to said servo fields; and setting means coupled to said determining means for setting the input range of said A/D convertor to a range within which high order level signals of said output signal corresponding to said data fields can be detected.

16. An apparatus for reproducing information as set forth in claim 15, wherein said peak level raising means includes a variable gain amplifier.

17. An apparatus for reproducing information as set forth in claim 16, wherein said A/D converter has an input range determined by a high level reference signal and a low level reference signal, said setting means being operative to raise the level of said low level reference signal at the time of A/D conversion of said output signal corresponding to said data fields.

18. An apparatus for reproducing information as set forth in claim 15, wherein said A/D converter has an input range determined by a high level reference signal and a low level reference signal, said setting means being operative to raise the level of said low level reference signal at the time of A/D conversion of said output signal corresponding to said data fields.

* * * * *